(12) United States Patent
Kanamaru

(10) Patent No.: US 7,234,127 B2
(45) Date of Patent: Jun. 19, 2007

(54) INTEGRATED CIRCUIT DESIGNING SUPPORT APPARATUS AND METHOD FOR THE SAME

(75) Inventor: Keisuke Kanamaru, Tokyo (JP)

(73) Assignee: NEC Corporation, Tokyo (JP)

( * ) Notice: Subject to any disclaimer, the term of this patent is extended or adjusted under 35 U.S.C. 154(b) by 257 days.

(21) Appl. No.: 11/001,069

(22) Filed: Dec. 2, 2004

(65) Prior Publication Data
US 2005/0120324 A1 Jun. 2, 2005

(30) Foreign Application Priority Data
Dec. 2, 2003 (JP) ............... 2003-403726

(51) Int. Cl.
*G06F 17/50* (2006.01)
(52) U.S. Cl. ................ 716/18; 716/17; 716/2
(58) Field of Classification Search ......... 716/2, 716/18, 17
See application file for complete search history.

(56) References Cited

U.S. PATENT DOCUMENTS 6,135,647 A * 10/2000 Balakrishnan et al. ........ 716/18
6,324,678 B1 * 11/2001 Dangelo et al. .............. 716/18
2002/0162086 A1 * 10/2002 Morgan ........................ 716/18
2005/0229143 A1 * 10/2005 Gehman et al. ............... 716/18

FOREIGN PATENT DOCUMENTS

JP H09-204460 A 8/1997
JP H11-102386 A 4/1999

* cited by examiner

*Primary Examiner*—Jack Chiang
*Assistant Examiner*—Binh Tat
(74) *Attorney, Agent, or Firm*—Sughrue Mion, PLLC

(57) ABSTRACT

An integrated circuit designing support apparatus includes a storage unit and a processing unit. The storage unit stores an RTL (Register Transfer Level) description with description of structurization for structurizing an RTL description model for an integrated circuit into modules, and a correspondence table which shows correspondence relation of each of output ports of a first module of the modules and a corresponding one of output ports of a second module of the modules. The processing unit structurizes the RTL description model into the modules, generates output port data indicating the output ports of each of the first and second modules, generates the correspondence table from the output port data to store in the storage unit, carries out a tracing operation on a signal route from each of the output ports of each of the first and second modules toward an input port side by using the correspondence table, and determines whether the first and second modules have an overlapping portion, based on the tracing operation results.

22 Claims, 8 Drawing Sheets

OPTIMIZATION

Fig. 4

```
module TEST (...);
        ⋮
//*#SUB ORG
assign 01=A&B
assign 02=A&B
//*#SUB END

⋮

//*#SUB DBL
assign 03=A&B
assign 04=A&B
//*#SUB END

⋮ endmodule
```

INTEGRATED CIRCUIT DESIGNING SUPPORT APPARATUS AND METHOD FOR THE SAME

BACKGROUND OF THE INVENTION

1. Field of the Invention

The present invention relates to an integrated circuit designing support apparatus and a method for the same.

2. Description of the Related Art

Rapid increase of personal computers and cellular phones leads increase of demand of semiconductor devices, together with higher reliability of the semiconductor device. A defect in an operation circuit such as ALU (Arithmetic and Logical Unit) is important since it causes a fatal problem in the semiconductor device.

Recently, design and manufacturing technique of a semiconductor device, especially LSI (Large-Scale Integrated circuit), has been remarkably and rapidly advanced. In a design stage of LSI, duplication of a circuit portion is carried out to produce a dual circuit of a first circuit and a second circuit so as to improve the reliability of the device. For example, in Japanese Laid Open Patent Application (JP-A-Heisei 11-102386), outputs of the first circuit and outputs of the second circuit are compared, and the design is changed when a difference is detected between the outputs Such a method of duplicating the circuit portion is effective to improve the reliability of LSI. In this method, there is a case that the first circuit and the second circuit are integrated into one circuit in a process of a logical synthesis in the design stage. The logic of the second circuit is basically same as that of the first circuit. For this reason, the first circuit and the second circuit are integrated erroneously when the circuit is optimized in the process of the logical synthesis in the design stage. FIG. 1 shows a state that the first circuit and the second circuit are integrated.

In conjunction with the above description, an integrated circuit designing apparatus is disclosed in Japanese Laid Open Patent Application (JP-A-Heisei 9-204460). In this conventional example, the integrated circuit designing support apparatus is used to support the designing of an integrated circuit by using a hardware description language. First and second circuit design data are divided in units of modules to generate a plurality of first and second module design data. Specified one or more of the plurality of first and second module design data are extracted and the extracted first and second module design data are compared with each other between corresponding modules to check whether the corresponding modules are logically same. In the other modules, it is checked whether cells and signal lines are completely same between the modules.

SUMMARY OF THE INVENTION

Therefore, an object of the present invention is to provide an integrated circuit designing support apparatus and a method for the same, in which a first circuit and a second circuit of a dual circuit are not integrated even if optimization through logical synthesis is carried out at a design stage.

Another object of the present invention is to provide an integrated circuit designing support apparatus and a method for the same, which can confirm whether a second circuit of a dual circuit is remained after logical synthesis.

In an aspect of the present invention, an integrated circuit designing support apparatus includes a storage unit and a processing unit. The storage unit stores an RTL (Register Transfer Level) description with description of structurization for structurizing an RTL description model for an integrated circuit into modules, and a correspondence table which shows correspondence relation of each of output ports of a first module of the modules and a corresponding one of output ports of a second module of the modules. The processing unit structurizes the RTL description model into the modules, generates output port data indicating the output ports of each of the first and second modules, generates the correspondence table from the output port data to store in the storage unit, carries out a tracing operation on a signal route from each of the output ports of each of the first and second modules toward an input port side by using the correspondence table, and determines whether the first and second modules have an overlapping portion, based on the tracing operation results.

Here, the storage unit may store a net list data of the first and second modules. The processing unit may include a circuit checking section which refers to the net list data to carry out the tracing operation on the signal route by using the correspondence table, and determines whether the first and second modules have an overlapping portion, based on the tracing operation results. In this case, the tracing operation may be carried out from the output port to a flip-flop or a primary input port.

Also, the processing unit may further include a logic synthesizing section which logic-synthesizes each of the first and second modules and converts the logic-synthesizing result into the net list data to store in the storage unit.

Also, the processing unit may include a structurizing section which structurizes the RTL description model into the modules by using the RTL description with description of structurization, and generates the output port data indicating the output ports of each of the first and second modules for every module.

Also, the processing unit may include a check position processing section which generates the correspondence table from the output port data to store in the storage unit. In this case, the check position processing section may generate the correspondence table from the output port data based on a check designation.

In another aspect of the present invention, a method of supporting design of an integrated circuit is achieved by structurizing an RTL description model into the modules; by generating output port data indicating the output ports of each of first and second modules of the modules; by generating from the output port data, a correspondence table indicating correspondence relation of each of the output ports of the first module and a corresponding one of the output ports of the second module; by carrying out a tracing operation on a signal route from each of the output ports of each of the first and second modules toward an input port side; and by determining whether the first and second modules have an overlapping portion, based on the tracing operation results.

Here, the tracing operation may be carried out from the output port to a flip-flop or a primary input port.

Also, the carrying out may be achieved by referring to a net list data of the first and second modules to carry out the tracing operating on the signal route by using the correspondence table.

Also, the method may be achieved by further including logic-synthesizing each of the first and second modules and converting the logic-synthesizing result into the net list data.

Also, the structurizing may be achieved by structurizing the RTL description model into the modules by using the RTL description with description of structurization.

Also, the generating the correspondence table from the output port data, may be achieved by generating the correspondence table from the output port data based on a check designation.

Another aspect of the present invention relates to a computer-readable software product. The software product realizes a method of supporting design of an integrated circuit described above.

BRIEF DESCRIPTION OF THE DRAWINGS

FIG. 4 shows an example of a description portion indicating the structurizing process of an RTL with designation of structurization in the embodiment;

DESCRIPTION OF THE PREFERRED EMBODIMENTS

Hereinafter, an integrated circuit designing support apparatus of the present invention will be described in detail with reference to the attached drawings.

Figure 1:
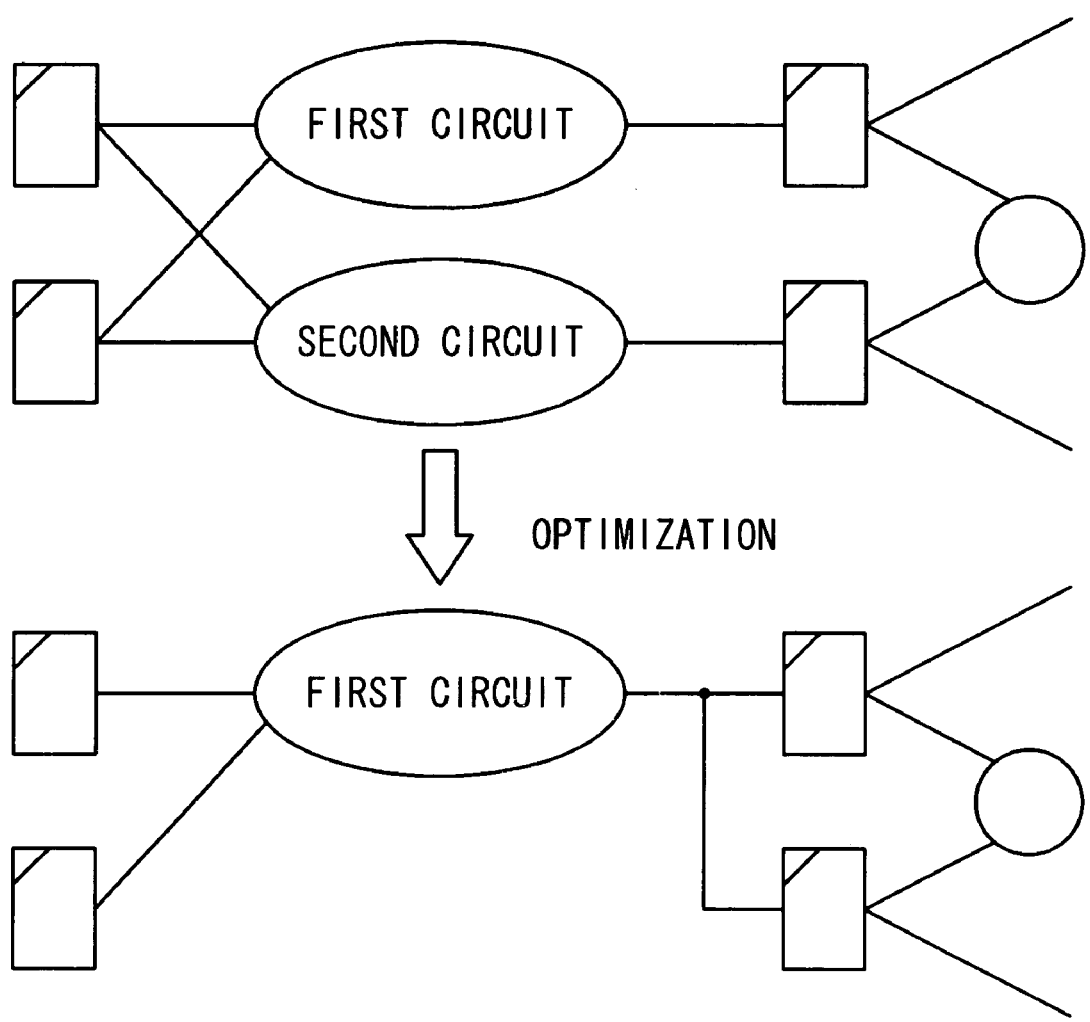
FIG. 1 is a diagram showing a state that first and second circuits of a dual circuit are integrated in a conventional example.
Figure 2:
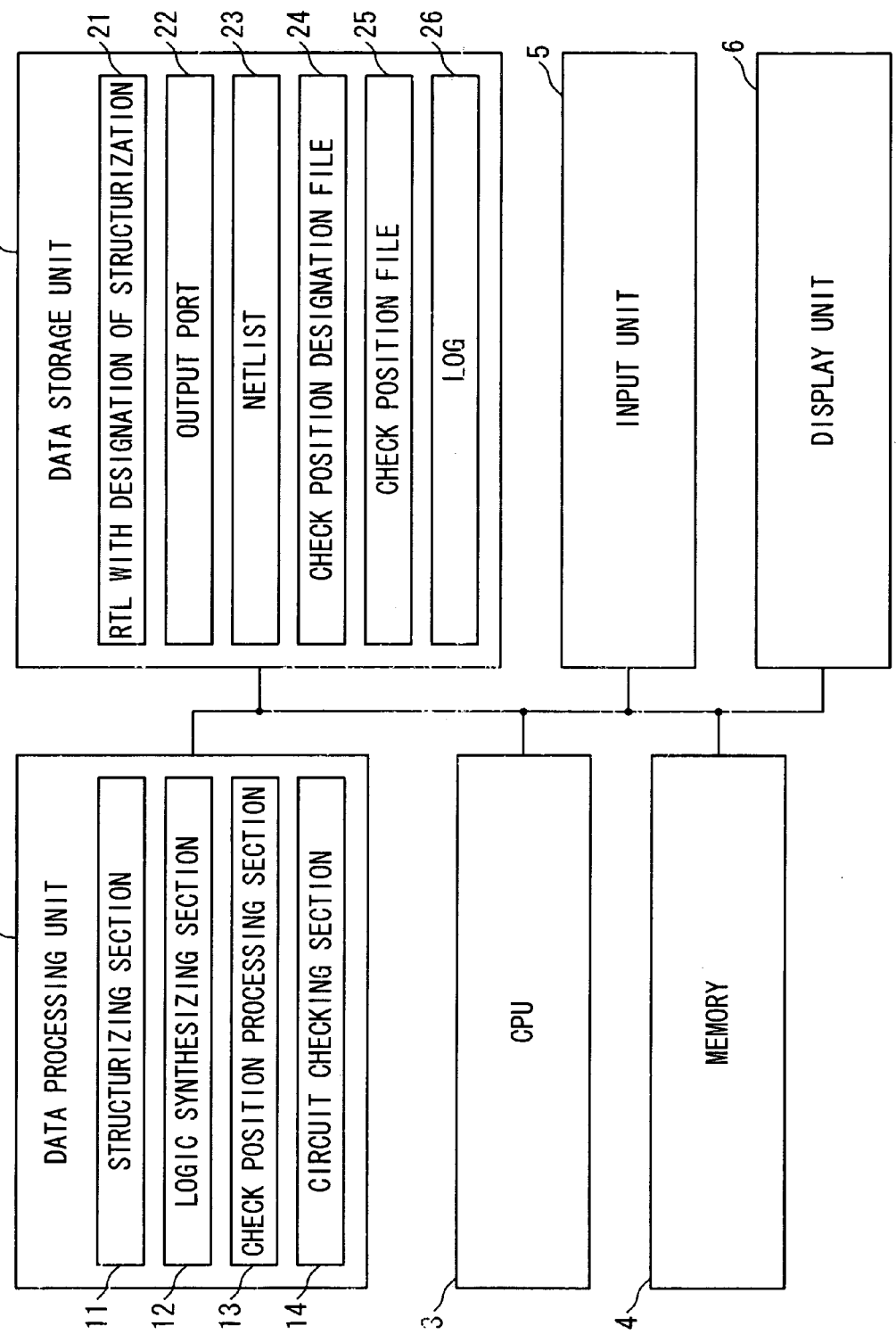
FIG. 2 is a block diagram showing the configuration of an integrated circuit designing support apparatus according to an embodiment of the present invention.

FIG. 2 is a block diagram showing the configuration of an integrated circuit designing support apparatus 10 according to an embodiment of the present invention. The integrated circuit designing support apparatus 10 is used to support the design of an integrated circuit such as an LSI, and hardware description written in HDL language (Hardware Description Language) and RTL (Register Transfer Level) language description can be used. Referring to FIG. 2, the integrated circuit designing support apparatus 10 includes a data processing unit 1, a data storage unit 2, and a CPU (central processing unit) 3, a memory 4, an input unit 5, and a display unit 6, which are connected through a bus.

The data processing unit 1 reads out a software program from the memory 4 and data stored in the data storage unit 2, and carries out processing of the read data based on the read software program. Also, the data processing unit 1 outputs a data processing result. The data storage unit 2 stores data outputted from the data processing unit 1 or data inputted from the input unit 5. The data storage unit 2 may be comprised of a semiconductor memory or a magnetic memory, and accessed by the data processing unit 1, the CPU (central processing unit) 3 and the input unit 5. The CPU 3 controls the whole operation of the integrated circuit designing support apparatus 10 based on a software program. The memory 4 stores a software grogram for the CPU 3 and a software program for the data processing unit 1. The input unit 5 is used to input data and instructions. The display unit 6 displays a data processing result by the data processing unit 1 or the CPU 3.

The data processing unit 1 includes a structurizing section 11, a logic synthesizing section 12, a check position processing section 13, and a circuit checking section 14.

The structurizing section 11 extracts a specified portion of an RTL description model and automatically structurizes the specified portion into modules. The structurizing section 11 determines input/output ports of each of the structured modules, and stores the determined output ports for every module in the data storage unit 2 as output port data 22. When a dual circuit is present, the dual circuit includes a first circuit and a second circuit, and each of the first and second circuits are structurized into at least one module.

The logic synthesizing section 12 carries out logic synthesis to a part or whole of the RTL description model and converts the result of the logic synthesis into a net list which is logically equivalent to the RTL description model, while the structure of the modules is kept, and stores the net list in the data storage unit 2 as the net list data 23. Also, the logic synthesizing section 12 optimizes the logic of the RTL description model at the same time with the conversion.

The check position processing section 13 reads out the output port data 22 and a check position designation file 24 from the data storage unit 2 and relates output ports of the first circuit of the dual circuit and output ports of the second circuit of the dual circuit in a specified portion of the RTL description model in units of output ports of the modules. Then, the check position processing section 13 stores a check position file 25 indicating correspondence relation of each output port of the first circuit and a corresponding output port of the second circuit in the specified portion in the storage unit 2 as the check position file 25.

The circuit checking section 14 reads out the net list data 23 and the check position file 25, and traces a fan-in cone on a net list shown by the net list data 23 from each of the output ports written in the check position file 25. That is, the circuit checking section 14 traces each of logic paths from the output port toward an input port until reaching a flip-flop or a primary input. Thus, the circuit checking section 14 determines whether or not the second circuit overlaps the first circuit, based on the tracing results. When the overlap is found, the circuit checking section 14 generates an error data and stores it in the data storage unit 2 as log data 26.

The data storage unit 2 includes a RTL with designation of structurization 21, the output port data 22, the net list data 23, the check position designation file 24, the check position file 25, and the log data 26.

The RTL description model describes a logic model between registers using HDL language such as a verilog-HDL language and VHDL language. The RTL with designation of structurization 21 includes a designation of structurization of the RTL description model for generating modules from the RTL description model.

The output port data 22 is a file in which the output ports are described for every structurized module and is stored in the data storage unit 2 by the structurizing section 11. The net list data 23 describes relations between gates and cells in ASIC (Application Specific Integrated Circuit) as an LSI to be designed. The net list data 23 is generated as the result of logic synthesis of the RTL description model 21 by the logic synthesizing section 12, and is stored in the data storage unit 2.

The check position designation file 24 indicates correspondence of a module name and each output port of the first circuit and a module name of the second circuit and a corresponding one of the output ports of the second circuit.

The check position file 25 indicates correspondence of a module name and each output port of the first circuit and a module name of the second circuit and a corresponding one of the output ports of the second circuit.

The log 26 stores error data indicating the existence of an overlapping portion between the first and second circuits and confirmation data indicating non-existence of the overlapping portion between the first and second circuits.

Figure 3:
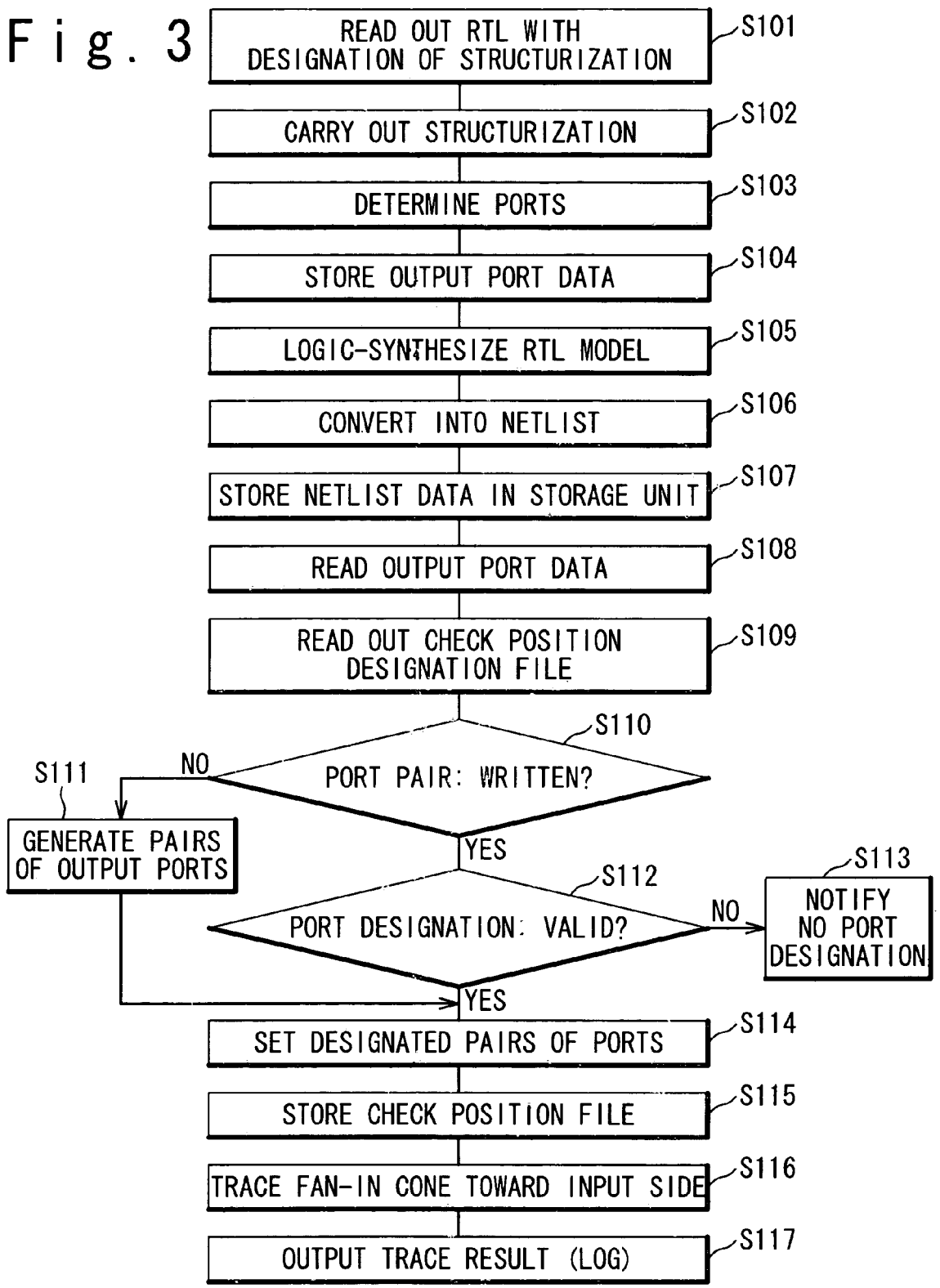
FIG. 3 is a flowchart showing an operation of the integrated circuit designing support apparatus according to the embodiment of the present invention.

FIG. 3 is a flowchart showing an operation of the integrated circuit designing support apparatus according to the embodiment of the present invention.

At a step S101, the structurizing section 11 of the data processing unit 1 reads out the RTL with designation of structurization 21 for an LSI as the integrated circuit to be designed from the data storage unit 2. The reading operation of the RTL with designation of structurization 21 is automatically carried out in response to a read instruction from the input unit 5 or when a design of a predetermined portion of the LSI is carried out. The predetermined portion may be designated by the RTL with designation of structurization 21 and may correspond to the dual circuit. In this example, at a step S102, the structurizing section 11 carries out the structurizing process of the first circuit and the second circuit in the dual circuit based on the read RTL with designation of structurization 21. As a result, at least one module of each of the first circuit and the second circuit is generated. The following description is made, supposing that one module is generated for each of the first circuit and the second circuit. The structurizing section 11 determines input ports and output ports in each of the modules from signal directions at a step S103, and generates the output port data 22 based on the determined output ports and stores the output port data 22 in the data storage unit 2 at a step s104. Then, the structurizing section 11 notifies the completion of the structurizing process to the logic synthesizing section 12.

At a step S105, the logic synthesizing section 12 reads out the RTL with designation of structurization 21 from the data storage unit 2 in response to the notice from the structurizing section 11 and carries out logical synthesis of at least portion of the RTL description model while the structure of the modules is kept. In this example the logic synthesizing section 12 carries out the logical synthesis to the dual circuit portion. Then, the logic synthesizing section 12 converts the result of the logical synthesis into a net list at a step S106, and stores it in the data storage unit 2 as the net list data 23 at a t a step S107. Then, the logic synthesizing section 12 notifies the completion of the generation of the net list data 23 to the check position processing section 13.

At a step S108, the check position processing section 13 reads out the output port data 22 from the data storage unit 2. Also, at a step S109, the check position processing section 13 further reads out the check position designation file 24 from the data storage unit 2. At a step S110, the check position processing section 13 determines whether any pair of output ports previously described in the read check position designation file 24 is present in the output port data 22. When any pair of output ports is not described in the check position designation file 24, the control proceeds to the step S111. When at least a pair of output ports is described in the check part designation file 24, the control proceeds to a step S112.

At the step S111, when the names of the modules of a pair are written but a pair of output ports is not written, the check position processing section 13 takes the output ports of each module from the output port data 22. When the names of the modules of a pair are not written and any pair of output ports is not written, the check position processing section 13 requests to input any pair of output ports together with the module names.

At the step S112, the check position processing section 13 determines whether designation of the pairs of output ports in the check position designation file 24 is erroneous. The previously specified output port of the first circuit should have one-to-one correspondence with any of the output port of the second circuit. The check position processing section 13 comparing each of the output ports described in the check position designation file 24 with the output port data 22, and determines whether the pairs of the output ports are complete or whether the output ports overlap. As the result of the determination, if there is no corresponding port or there is an overlapped port, the check position processing section 13 notifies a defect of the port specification (step S113). The integrated circuit designing support apparatus 10 displays a warning on the display unit 6 in response to the notification.

At a step S114, the check position processing section 13 generates a check position file 25 showing correspondence between output ports of each of the pairs designated by the check position designation file 24 based on the read output port data 22. At a step S115, the check position processing section 13 stores the generated check position file 25 in the data storage unit 2 and notifies the completion of the generation of the check position file 25.

At a step S116, the circuit checking section 14 reads out the net list 23 and the check position file 25 from the data storage unit 2 in response to the notification from the check position processing section 13. The circuit checking section 14 extracts the output ports of the first circuit and the second circuit from the read check position file 25, and carries out a tracing operation on a signal route from each of the extracted output ports toward the input port side until reaching a flip-flop or a primary input port. The circuit checking section 14 determines whether at least an overlapping portion exists between the signal routes of the output ports of each pair, based on the results of the tracing operations. After the completion of the tracing operation to each of the output ports of all the pairs, at a step S117, the circuit checking section 14 generates as the log data 26 for every pair, the error data indicating the existence of at least an overlapping portion between the signal routes of the first and second circuits and the confirmation data indicating non-existence of any overlapping portion between the signal routes of the first and second circuits. The log data 26 are stored in the data storage unit 2. Thereafter, the data processing unit 1 reads out the log data 26 and displays it on the display unit 6.

The operation of the embodiment will be described by using a specific example of the description in the RTL with designation of structurization 21. FIG. 4 shows an example of a description portion indicating the structurizing process of the RTL with designation of structurization 21. In the description portion shown in FIG. 4, a line started at "//*#SUB" means a reserved comment for a designation of structurization. The description of "//*# SUB???" shows the start of the designation about a module, and "//*#SUB END" shows the end of the designation about the module. "???" shows the module name. In the example shown in FIG. 4, two modules of ORG and DBL are specified in the RTL with designation of structurization 21. A description between "//*#SUB ORG" and "//*#SUB END" indicates that port numbers of the output ports of the module ORG is "01" and "02". In the same way, a description between "//*#SUB DBL" and "//*#SUB END" indicates that the port numbers of the output ports of the module DBL is "03" and "04".

At the step S101 shown in FIG. 3, the structurizing section 11 reads out the RTL with designation of structurization 21 which contains the above-mentioned descriptions. At the step S102, the structurizing section 11 allocates the HDL language description described between "//*#SUB ORG" and "//*#SUB END" to the module ORG. In the same way, the structurizing section 11 allocates the HDL language description described between "//*#SUB DBL" and "//*#SUB END" to the module DBL.

Figure 5:
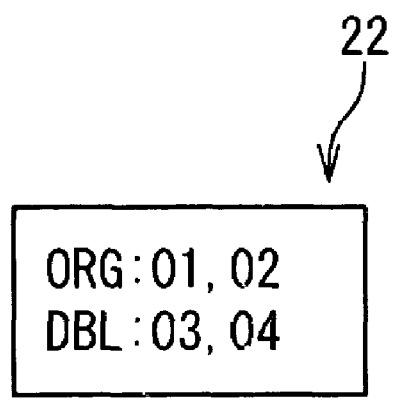
FIG. 5 shows a specific example of an output port data in the embodiment.

FIG. 5 shows a specific example of the output port data 22 outputted at the time of the allocation. Referring to FIG. 5, the output port data 22 contains a table where the module names and the output ports are written. The logic synthesizing section 12 carries out the logic synthesis to the RTL language model, and converts the result of the logic synthesis into the logically equivalent net list data 23 while keeping the module structure. Therefore, there is no possibility that any one of the module ORG and the module DBL is extinguished, even if the optimization is carried out together with the logic synthesis. As a result, reliability of the circuit to be designed is improved.

Figure 6:
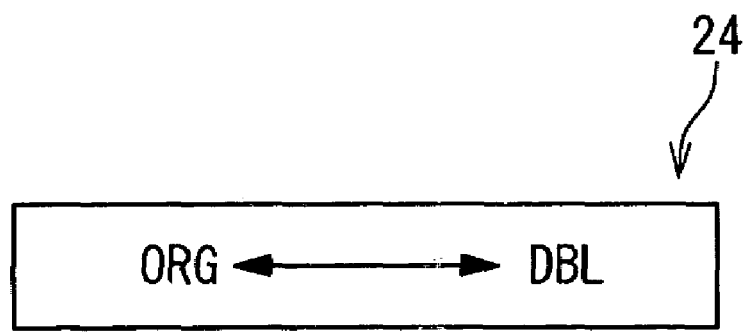
FIGS. 6 and 7 show specific examples of a check position designation file in the embodiment.
Figure 7:
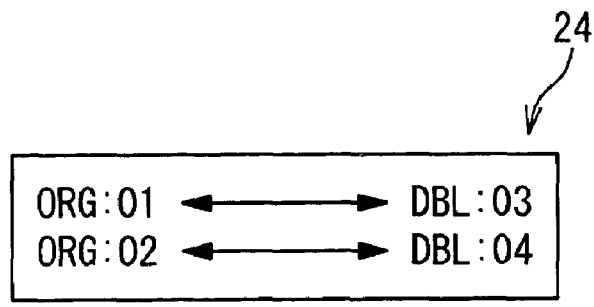
Figure 8:
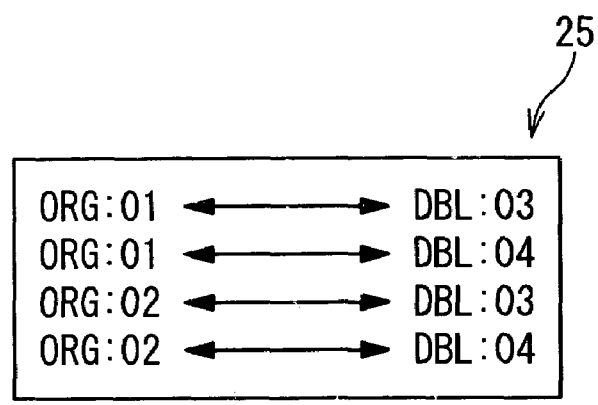
FIG. 8 is a diagram showing a first example of a check position designation file.

The check position processing section 13 reads out the output port data 22 and the check position designation file 24 in response to the notification from the logic synthesizing section 12 (the steps S108 and S109 shown in FIG. 3). FIGS. 6 and 7 show specific examples of the check position designation file 24. The check position designation file 24 shown in FIG. 6 indicates an example of designation of the modules, and the description shown in FIG. 7 indicates an example of designation based on the module name and the port number. When the check position designation file 24 shown in FIG. 6 is read out by the check position processing section 13, the check position processing section 13 takes the output ports of each of the first and second circuits from the output port data 22. The check position processing section 13 generates the pairs of the output ports having a round-robin correspondence from the output ports of each of the modules corresponding to the first and second circuits, as shown in FIG. 8.

Figure 9:
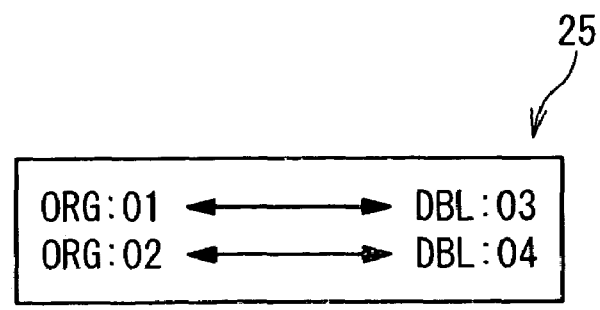
FIG. 9 is a diagram showing a second example of the check position designation file.

The circuit checking section 14 reads out the net list data 23 and the check position file 25 in response to the notification from the check position processing section 13. The circuit checking section 14 extracts the output ports of the first and second circuits from the check position file 25. Then, the circuit checking section 14 carries out the tracing operation to a signal route from each of the extracted output ports toward the input port side until the flip-flop or the primary input. After the tracing operations from the output ports of the pair, the circuit checking section 14 determines or detects whether at least a portion of the signal routes for the pair overlaps, based on the tracing operation results. The circuit checking section 14 generates as the log data 26 for the pair, the error data indicating the existence of at least an overlapping portion between the signal routes of the first and second circuits or the confirmation data indicating non-existence of any overlapping portion between the signal routes of the first and second circuits. The log data 26 are stored in the data storage unit 2. The above process is repeated over all the pairs of the output ports. Thereafter, the data processing unit 1 reads out the log data 26 and displays it on the display unit 6, after the completion of the determination over all the pairs of the output ports. When the check position designation file 24 shown in FIG. 7 is read out by the check position processing section 13, the check position processing section 13 generates the pairs of the output ports from the check position designation file 24, without taking the output ports of each of the first and second circuits from the output port data 22. Thus, the check position file 25 is generated shown in FIG. 9. Thereafter, the same process as described above is carried out.

As a result, it is easy to confirm whether the dual circuit operates appropriately and the reliability of the circuit to be designed improves.

Figure 10:
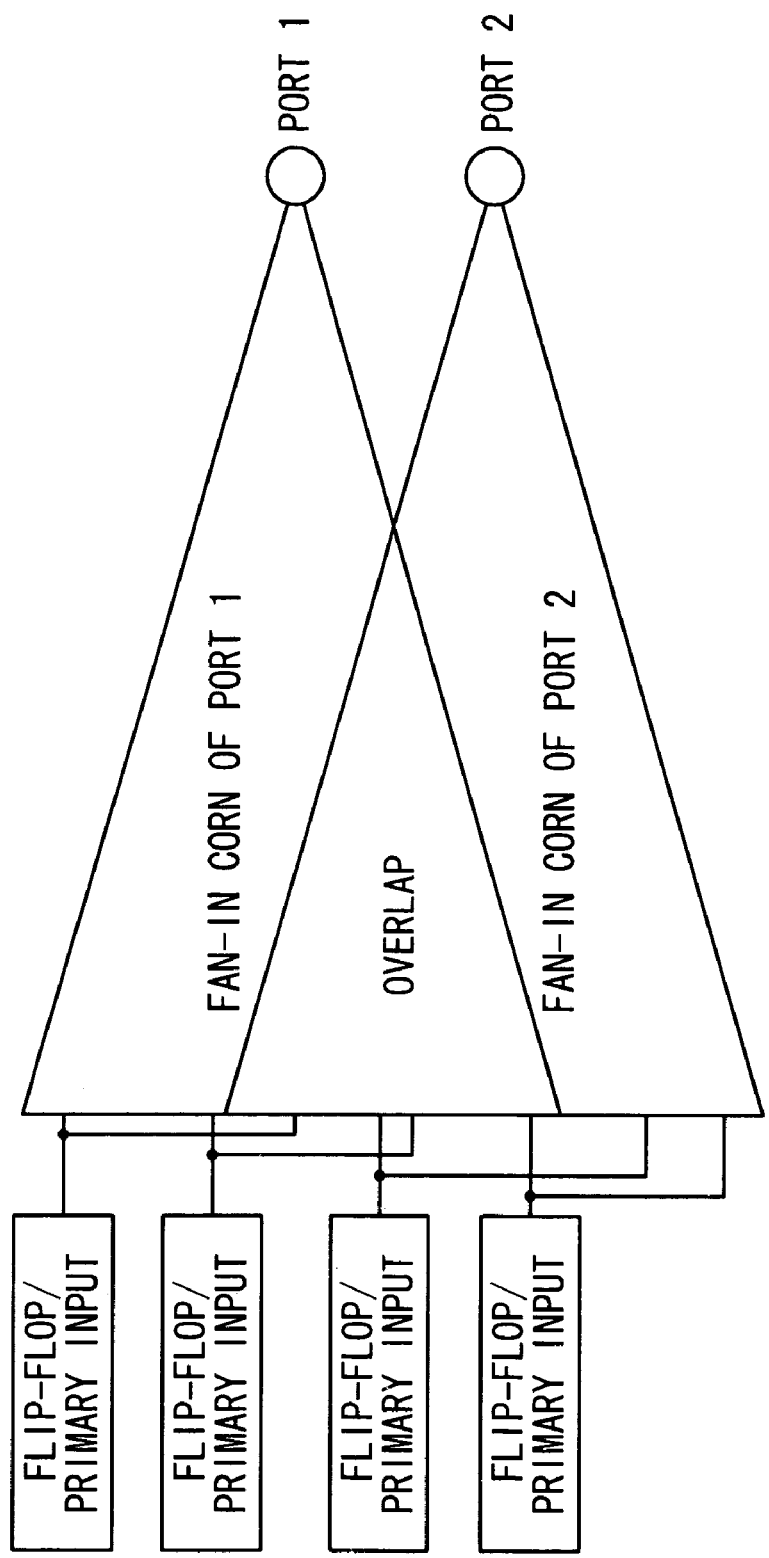
FIGS. 10 and 11 are diagrams showing checking results when an overlapping portion is found in the tracing operations and when any overlapping portion is not found in the tracing operations.
Figure 11:
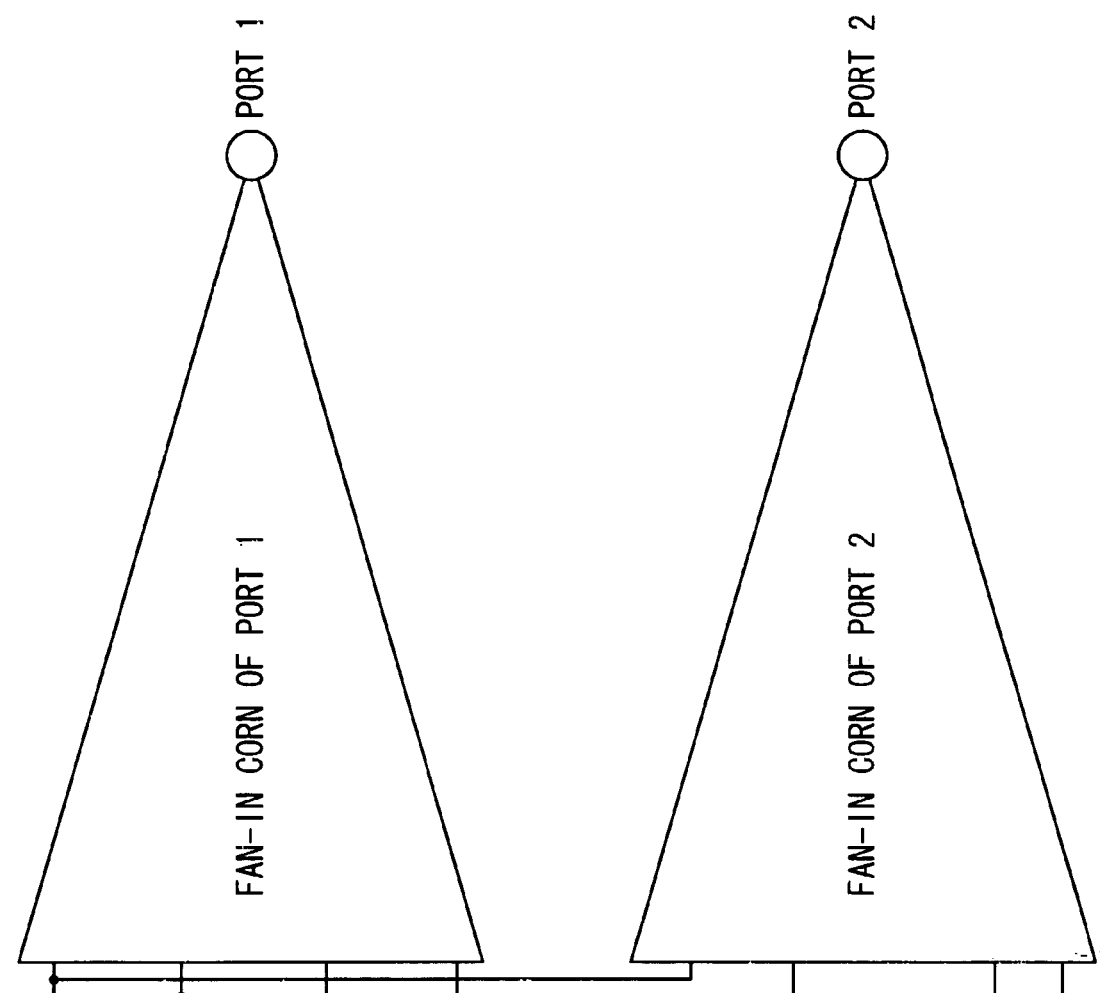

FIGS. 10 and 11 are schematic diagrams showing check results of an overlapped portion in the dual circuit carried out by the circuit checking section 14. FIG. 10 shows a state that an overlapping portion can be found in the tracing operations started from the output ports 1 and 2. When such an overlapping portion is detected, the circuit checking section 14 determines that a defect has been occurred in the dual circuit, and stores the error data showing generation of the defect in the data storage unit 2 as the log data 26. FIG. 11 shows a state that any overlapping portion cannot be found in the tracing operation results started from the output port 1 and 2. When such a state of no overlapping portion is detected, the circuit checking section 14 stores the confirmation data showing that the dual circuit has been held properly in the data storage unit 2 as the log data 26.

In the above description, if the check position designation file 24 always includes the pairs of the output ports to be traced, the check position processing section may be omitted.

Also, the check position processing section 13 operates in response to the notification from the logic synthesizing section 12. However, the check position processing section 13 may operate in response to the notification from the logic synthesizing section 12 and the notification from the structurizing section 11. Also, the circuit checking section 14 operates in response to the notification from the check position processing section 13. However, the circuit checking section 14 may operate in response to the notification from the check position processing section 13 and the logic synthesizing section 12.

If the net list data 23 is previously provided, the logic synthesizing section 12 may be omitted. However, in this case, it is necessary that a portion of the net list corresponding to the module can be designated.

Also, the data processing unit and the CPU may be same.

What is claimed is:

1. An integrated circuit designing support apparatus comprising:
   a storage unit which stores:
      a circuit behavior description and a description of structurizing a circuit behavior description model for an integrated circuit, into modules, and
      a correspondence table configured to show correspondence of output ports of a first module of said modules and of output ports of a second module of said modules; and
   a processing unit configured to structurize said circuit behavior description into said modules, generate output port data indicating said output ports of said first and second modules, generate said correspondence table from said output port data for storage in said storage unit, carry out a tracing operation on a signal route from said output ports of said first and second modules toward an input port side based on said correspondence table, and determine whether said first and second modules have an overlapping portions based on the tracing operation results.

2. The integrated circuit designing support apparatus according to claim 1, wherein said storage unit stores a net list data of said first and second modules, and said processing unit comprises a circuit checking section which refers to said net list data to carry out said tracing operation on said signal route by using said correspondence table, and determines whether said first and second modules have an overlapping portion based on the tracing operation results.

3. The integrated circuit designing support apparatus according to claim 2, wherein said tracing operation is carried out from one of said output ports to a flip-flop or a primary input port.

4. The integrated circuit designing support apparatus according to claim 2, wherein said processing unit further comprises:
   a logic synthesizing section configured to logic synthesizes said first and second modules and converts the logic-synthesizing result into said net list data to store in said storage unit.

5. The integrated circuit designing support apparatus according to claim 1, wherein said processing unit comprises a structurizing section which structurizes said circuit behavior description model into said modules based on said circuit behavior description, and generates said output port data showing said output ports of said first and second modules for every module.

6. The integrated circuit designing support apparatus according to claim 1, wherein said processing unit comprises a check position processing section which generates said correspondence table based on said output port data, to store in said storage unit.

7. The integrated circuit designing support apparatus according to claim 6, wherein said check position processing section generates said correspondence table based on said output port data based on a check designation.

8. The integrated circuit designing support apparatus according to claim 1, wherein the circuit behavior description is a register transfer level description.

9. A method of supporting design of an integrated circuit, comprising:
   structurizing a circuit behavior description model into modules;
   generating output port data showing output ports of first and second modules of said modules;
   generating from said output port data, a correspondence table showing correspondence of said output ports or said first module and a corresponding one of said output ports of said second module;
   carrying out a tracing operation on a signal route from said output ports said first and second modules toward an input port side; and
   determining whether said first and second modules have an overlapping portion, based on the tracing operation results.

10. The method according to claim 9, wherein said tracing operation is carried out from at least one of said output ports to a flip-flop or a primary input port.

11. The method according to claim 10, further comprising logic-synthesizing said first and second modules and converting the logic-synthesizing result into said net list data.

12. The method according to claim 9, wherein said carrying out comprises referring to a net list data of said first and second modules in order to accomplish said tracing operating on said signal route based on said correspondence table.

13. The method according to claim 9, wherein said structurizing comprises structurizing said circuit behavior description model into said modules based on said circuit behavior description.

14. The method according to claim 9, wherein said generating said correspondence table from said output port data, comprises generating said correspondence table from said output port data based on a check designation.

15. The method according to claim 9, wherein the circuit behavior description model is a register transfer level description model.

16. A computer program product for enabling a computer to be support apparatus for the design of an integrated circuit, comprising:
   a computer readable medium; and
   software instructions on the computer readable medium adapted to enable the computer to perform operations of:
      structurizing a circuit behavior description model into modules;
      generating output port data showing said output ports of first and second modules of said modules;
      generating from said output port data, a correspondence table showing correspondence of said output ports of said first module and a corresponding output ports of second module;
      carrying out a tracing operation on a signal route from said output ports of said first and second modules toward an input port side; and
      determining whether said first and second modules have an overlapping portion based on tracing operation results.

17. The computer program product according to claim 16, wherein said tracing operation is carried out from at least one of said output ports to a flip-flop or a primary input port.

18. The computer program product according to claim 17, said software instructions further comprising logic-synthesizing said first and second modules and converting a logic-synthesizing result into said net list data.

19. The computer program product according to claim 16, wherein said carrying out comprises referring to a net list data of said first and second modules in order to accomplish said tracing operating on said signal route by using said correspondence table.

20. The computer program product according to claim 16, wherein structurizing instruction comprises structurizing said circuit behavior description model into said modules by using said circuit behavior description.

21. The computer program product according to claim 16, wherein said generating said correspondence table from said output port data comprises generating said correspondence table from said output port data based on a check designation.

22. The computer program product according to claim 16, wherein the circuit behavior description model is a register transfer level description model.

* * * * *